(12) United States Patent
Dunklee (10) Patent No.: US 7,221,172 B2
(45) Date of Patent: May 22, 2007

(54) SWITCHED SUSPENDED CONDUCTOR AND CONNECTION

(75) Inventor: John Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 10/794,511

(22) Filed: Mar. 5, 2004

(65) Prior Publication Data

US 2004/0222807 A1    Nov. 11, 2004

Related U.S. Application Data

(60) Provisional application No. 60/468,851, filed on May 6, 2003.

(51) Int. Cl.
G01R 31/02 (2006.01)
G01R 31/26 (2006.01)

(52) U.S. Cl. .................... 324/754; 324/755; 324/158.1

(58) Field of Classification Search ........ 324/750–765, 324/158.1
See application file for complete search history.

(56) References Cited

U.S. PATENT DOCUMENTS

| | | | |
|---|---|---|---|
| 1,337,866 A | 4/1920 | Whitaker |
| 2,142,625 A | 1/1939 | Zoethout |
| 2,197,081 A | 4/1940 | Piron |
| 2,376,101 A | 5/1945 | Tyzzer |
| 2,389,668 A | 11/1945 | Johnson |
| 2,471,897 A | 5/1949 | Rappl |
| 2,812,502 A | 11/1957 | Doherty |
| 3,176,091 A | 3/1965 | Hanson et al. |
| 3,185,927 A | 5/1965 | Marqulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziejowski |
| 3,256,484 A | 6/1966 | Terry |
| 3,265,969 A | 8/1966 | Calu |
| 3,289,046 A | 11/1966 | Carr |
| 3,333,274 A | 7/1967 | Forcier |
| 3,405,361 A | 10/1968 | Kattner et al. |
| 3,408,565 A | 10/1968 | Frick et al. |
| 3,435,185 A | 3/1969 | Garard |
| 3,484,679 A | 12/1969 | Hodgson et sl. |
| 3,596,228 A | 7/1971 | Reed, Jr. et al. |
| 3,602,845 A | 8/1971 | Agrios et al. |
| 3,609,539 A | 9/1971 | Gunthert et al. |
| 3,648,169 A | 3/1972 | Wiesler |
| 3,654,573 A | 4/1972 | Graham |

(Continued)

FOREIGN PATENT DOCUMENTS

DE    29 12 826    10/1980

(Continued)

OTHER PUBLICATIONS

Christophe Risacher, Vessen Vassilev, Alexey Pavolotsky, and Victor Belitsky, "Waveguide-to-Microstrip Transition With integrated Bias-T," IEEE Microwave and Wireless Components Letters, vol. 13, No. 7, Jul. 2003, pp. 262-264.

(Continued)

*Primary Examiner*—Ha Tran Nguyen
*Assistant Examiner*—Emily Y Chan
(74) *Attorney, Agent, or Firm*—Chernoff, Vilhauer, McClung & Stenzel (57) ABSTRACT

A probe assembly having a switch that selectively electrically connects, for example, either a Kelvin connection or a suspended guard element with the probe assembly.

18 Claims, 5 Drawing Sheets

U.S. PATENT DOCUMENTS

| | | |
|---|---|---|
| 3,662,318 A | 5/1972 | Decuyper |
| 3,710,251 A | 1/1973 | Hagge et al. |
| 3,714,572 A | 1/1973 | Ham et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,970,934 A | 7/1976 | Aksu |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,342,958 A * | 8/1982 | Russell .................. 324/754 |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,414,638 A | 11/1983 | Talambiras |
| 4,419,626 A | 12/1983 | Cedrone et al. |
| 4,425,395 A | 1/1984 | Negishi et al. |
| 4,426,619 A | 1/1984 | Demand |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,528,504 A | 7/1985 | Thornton, Jr. et al. |
| 4,531,474 A | 7/1985 | Inuta |
| 4,532,423 A | 7/1985 | Tojo et al. |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,970 A | 5/1986 | Donecker et al. |
| 4,621,169 A | 11/1986 | Petinelli et al. |
| 4,626,618 A | 12/1986 | Takaoka et al. |
| 4,642,417 A | 2/1987 | Ruthrof et al. |
| 4,646,005 A | 2/1987 | Ryan |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,711,563 A | 12/1987 | Lass |
| 4,712,370 A | 12/1987 | MacGee |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,744,041 A | 5/1988 | Strunk et al. |
| 4,755,746 A | 7/1988 | Mallory et al. |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,771,234 A | 9/1988 | Cook et al. |
| 4,772,846 A | 9/1988 | Reeds |
| 4,777,434 A | 10/1988 | Miller et al. |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason et al. |
| 4,853,613 A | 8/1989 | Sequeira et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,893,914 A | 1/1990 | Hancock et al. |
| 4,894,612 A | 1/1990 | Drake et al. |
| 4,896,109 A | 1/1990 | Rauscher |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,916,398 A | 4/1990 | Rath |
| 4,918,279 A | 4/1990 | Babel et al. |
| 4,918,374 A | 4/1990 | Stewart et al. |
| 4,923,407 A | 5/1990 | Rice et al. |
| 4,926,118 A | 5/1990 | O'Connor et al. |
| 4,933,634 A | 6/1990 | Cuzin et al. |
| 4,968,931 A | 11/1990 | Littlebury et al. |
| 4,978,907 A | 12/1990 | Smith |
| 4,978,914 A | 12/1990 | Akimoto et al. |
| 4,982,153 A | 1/1991 | Collins et al. |
| 4,994,737 A | 2/1991 | Carlton et al. |
| 5,001,423 A | 3/1991 | Abrami et al. |
| 5,006,796 A | 4/1991 | Burton et al. |
| 5,010,296 A | 4/1991 | Okada et al. |
| 5,019,692 A | 5/1991 | Nbedi et al. |
| 5,030,907 A | 7/1991 | Yih et al. |
| 5,034,688 A | 7/1991 | Moulene et al. |

| Patent | Date | Name |
|---|---|---|
| 5,041,782 A | 8/1991 | Marzan |
| 5,045,781 A | 9/1991 | Gleason et al. |
| 5,061,823 A | 10/1991 | Carroll |
| 5,065,089 A | 11/1991 | Rich |
| 5,065,092 A | 11/1991 | Sigler |
| 5,066,357 A | 11/1991 | Smyth, Jr. et al. |
| 5,070,297 A | 12/1991 | Kwon et al. |
| 5,077,523 A | 12/1991 | Blanz |
| 5,084,671 A | 1/1992 | Miyata et al. |
| 5,089,774 A | 2/1992 | Nakano |
| 5,091,691 A | 2/1992 | Kamieniecki et al. |
| 5,095,891 A | 3/1992 | Reitter |
| 5,097,207 A | 3/1992 | Blanz |
| 5,101,149 A | 3/1992 | Adams et al. |
| 5,101,453 A | 3/1992 | Rumbaugh |
| 5,103,169 A | 4/1992 | Heaton et al. |
| 5,105,148 A | 4/1992 | Lee |
| 5,105,181 A | 4/1992 | Ross |
| 5,107,076 A | 4/1992 | Bullock et al. |
| 5,142,224 A | 8/1992 | Smith et al. |
| 5,144,228 A | 9/1992 | Sorna et al. |
| 5,159,752 A | 11/1992 | Mahant-Shetti et al. |
| 5,160,883 A | 11/1992 | Blanz |
| 5,164,661 A | 11/1992 | Jones |
| 5,166,606 A | 11/1992 | Blanz |
| 5,172,049 A | 12/1992 | Kiyokawa et al. |
| 5,198,752 A | 3/1993 | Miyata et al. |
| 5,198,753 A | 3/1993 | Hamburgen |
| 5,198,756 A | 3/1993 | Jenkins et al. |
| 5,198,758 A | 3/1993 | Iknaian et al. |
| 5,202,558 A | 4/1993 | Barker |
| 5,209,088 A | 5/1993 | Vaks |
| 5,210,485 A | 5/1993 | Kreiger et al. |
| 5,214,243 A | 5/1993 | Johnson |
| 5,214,374 A | 5/1993 | St. Onge |
| 5,218,185 A | 6/1993 | Gross |
| 5,220,277 A | 6/1993 | Reitinger |
| 5,221,905 A | 6/1993 | Bhangu et al. |
| 5,225,037 A | 7/1993 | Elder et al. |
| 5,225,796 A | 7/1993 | Williams et al. |
| 5,237,267 A | 8/1993 | Harwood et al. |
| 5,266,889 A | 11/1993 | Harwood et al. |
| 5,278,494 A | 1/1994 | Obigane |
| 5,280,156 A | 1/1994 | Niori et al. |
| 5,303,938 A | 4/1994 | Miller et al. |
| 5,315,237 A | 5/1994 | Iwakura et al. |
| 5,321,352 A | 6/1994 | Takebuchi |
| 5,325,052 A | 6/1994 | Yamashita |
| 5,334,931 A | 8/1994 | Clarke et al. |
| 5,336,989 A | 8/1994 | Hofer |
| 5,345,170 A | 9/1994 | Schwindt et al. |
| 5,369,370 A | 11/1994 | Stratmann et al. |
| 5,371,457 A | 12/1994 | Lipp |
| 5,373,231 A | 12/1994 | Boll et al. |
| 5,382,898 A | 1/1995 | Subramanian |
| 5,397,855 A | 3/1995 | Ferlier |
| 5,404,111 A | 4/1995 | Mori et al. |
| 5,408,189 A | 4/1995 | Swart et al. |
| 5,410,259 A | 4/1995 | Fujihara et al. |
| 5,422,574 A | 6/1995 | Kister |
| 5,434,512 A | 7/1995 | Schwindt et al. |
| 5,451,884 A | 9/1995 | Sauerland |
| 5,457,398 A | 10/1995 | Schwindt et al. |
| 5,461,328 A | 10/1995 | Devereaux et al. |
| 5,469,324 A | 11/1995 | Henderson et al. |
| 5,475,316 A | 12/1995 | Hurley et al. |
| 5,477,011 A | 12/1995 | Singles et al. |
| 5,479,108 A | 12/1995 | Cheng |
| 5,479,109 A | 12/1995 | Lau et al. |
| 5,481,936 A | 1/1996 | Yanagisawa |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,546,012 A | 8/1996 | Perry et al. |
| 5,550,480 A * | 8/1996 | Nelson et al. ............... 324/754 |
| 5,550,482 A | 8/1996 | Sano |
| 5,552,716 A | 9/1996 | Takahashi et al. |
| 5,561,377 A | 10/1996 | Strid et al. |
| 5,561,585 A | 10/1996 | Barnes et al. |
| 5,565,788 A | 10/1996 | Burr et al. |
| 5,571,324 A | 11/1996 | Sago et al. |
| 5,572,398 A | 11/1996 | Federlin et al. |
| 5,583,445 A | 12/1996 | Mullen |
| 5,594,358 A | 1/1997 | Ishikawa et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,629,631 A | 5/1997 | Perry et al. |
| 5,631,571 A | 5/1997 | Spaziani et al. |
| 5,640,101 A | 6/1997 | Kuji et al. |
| 5,646,538 A | 7/1997 | Lide et al. |
| 5,657,394 A | 8/1997 | Schwartz et al. |
| 5,659,255 A | 8/1997 | Strid et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,888 A | 9/1997 | Cheng |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishawy et al. |
| 5,685,232 A | 11/1997 | Inoue |
| 5,712,571 A | 1/1998 | O'Donoghue |
| 5,729,150 A | 3/1998 | Schwindt |
| 5,731,708 A | 3/1998 | Sobhami |
| 5,773,951 A | 6/1998 | Markowski et al. |
| 5,777,485 A | 7/1998 | Tanaka et al. |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,828,225 A | 10/1998 | Obikane et al. |
| 5,831,442 A | 11/1998 | Heigl |
| 5,835,997 A | 11/1998 | Yassine |
| 5,838,161 A | 11/1998 | Akram et al. |
| 5,847,569 A | 12/1998 | Ho et al. |
| 5,848,500 A | 12/1998 | Kirk |
| 5,857,667 A | 1/1999 | Lee |
| 5,861,743 A | 1/1999 | Pye et al. |
| 5,869,975 A | 2/1999 | Strid et al. |
| 5,874,361 A | 2/1999 | Collins et al. |
| 5,879,289 A | 3/1999 | Yarush et al. |
| 5,883,522 A | 3/1999 | O'Boyle |
| 5,883,523 A | 3/1999 | Ferland et al. |
| 5,892,539 A | 4/1999 | Colvin |
| 5,900,737 A | 5/1999 | Graham et al. |

| | | |
|---|---|---|
| 5,903,143 A | 5/1999 | Mochizuki et al. |
| 5,910,727 A | 6/1999 | Fujihara et al. |
| 5,916,689 A | 6/1999 | Collins et al. |
| 5,923,177 A | 7/1999 | Wardwell |
| 5,942,907 A | 8/1999 | Chiang |
| 5,945,836 A | 8/1999 | Sayre et al. |
| 5,949,579 A | 9/1999 | Baker |
| 5,952,842 A | 9/1999 | Fujimoto |
| 5,959,461 A | 9/1999 | Brown et al. |
| 5,960,411 A | 9/1999 | Hartman et al. |
| 5,963,027 A | 10/1999 | Peters |
| 5,963,364 A | 10/1999 | Leong et al. |
| 5,973,505 A | 10/1999 | Strid et al. |
| 5,982,166 A | 11/1999 | Mautz |
| 5,995,914 A | 11/1999 | Cabot |
| 5,998,768 A | 12/1999 | Hunter et al. |
| 5,999,268 A | 12/1999 | Yonezawa et al. |
| 6,001,760 A | 12/1999 | Katsuda et al. |
| 6,002,263 A | 12/1999 | Peters et al. |
| 6,002,426 A | 12/1999 | Back et al. |
| 6,013,586 A | 1/2000 | McGhee et al. |
| 6,023,209 A | 2/2000 | Faulkner et al. |
| 6,028,435 A | 2/2000 | Nikawa |
| 6,029,141 A | 2/2000 | Bezos et al. |
| 6,031,383 A | 2/2000 | Streib et al. |
| 6,034,533 A | 3/2000 | Tervo et al. |
| 6,037,785 A | 3/2000 | Higgins |
| 6,037,793 A | 3/2000 | Miyazawa et al. |
| 6,043,667 A | 3/2000 | Cadwallader et al. |
| 6,049,216 A | 4/2000 | Yang et al. |
| 6,052,653 A | 4/2000 | Mazur et al. |
| 6,054,869 A | 4/2000 | Hutton et al. |
| 6,060,888 A | 5/2000 | Blackham et al. |
| 6,060,891 A | 5/2000 | Hembree et al. |
| 6,078,183 A | 6/2000 | Cole, Jr. |
| 6,091,236 A | 7/2000 | Piety et al. |
| 6,091,255 A | 7/2000 | Godfrey |
| 6,096,567 A | 8/2000 | Kaplan et al. |
| 6,100,815 A * | 8/2000 | Pailthorp .................... 324/754 |
| 6,104,203 A | 8/2000 | Costello et al. |
| 6,111,419 A | 8/2000 | Lefever et al. |
| 6,114,865 A | 9/2000 | Lagowski et al. |
| 6,118,894 A | 9/2000 | Schwartz et al. |
| 6,121,783 A | 9/2000 | Horner et al. |
| 6,124,723 A | 9/2000 | Costello |
| 6,124,725 A | 9/2000 | Sato |
| 6,127,831 A | 10/2000 | Khoury et al. |
| 6,130,544 A | 10/2000 | Strid et al. |
| 6,137,302 A | 10/2000 | Schwindt |
| 6,137,303 A | 10/2000 | Deckert et al. |
| 6,144,212 A | 11/2000 | Mizuta |
| 6,147,851 A | 11/2000 | Anderson |
| 6,160,407 A | 12/2000 | Nikawa |
| 6,194,907 B1 | 2/2001 | Kanao et al. |
| 6,198,299 B1 | 3/2001 | Hollman |
| 6,211,663 B1 | 4/2001 | Moulthrop et al. |
| 6,222,970 B1 | 4/2001 | Wach et al. |
| 6,232,787 B1 | 5/2001 | Lo et al. |
| 6,232,788 B1 * | 5/2001 | Schwindt et al. ........... 324/754 |
| 6,232,789 B1 | 5/2001 | Schwindt |
| 6,232,790 B1 | 5/2001 | Bryan et al. |
| 6,236,975 B1 | 5/2001 | Boe et al. |
| 6,236,977 B1 | 5/2001 | Verba et al. |
| 6,245,692 B1 | 6/2001 | Pearce et al. |
| 6,252,392 B1 | 6/2001 | Peters |
| 6,257,319 B1 | 7/2001 | Kainuma et al. |
| 6,259,261 B1 | 7/2001 | Engelking et al. |
| 6,271,673 B1 | 8/2001 | Furuta et al. |
| 6,284,971 B1 | 9/2001 | Atalar et al. |
| 6,288,557 B1 | 9/2001 | Peters et al. |
| 6,292,760 B1 | 9/2001 | Burns |
| 6,300,775 B1 | 10/2001 | Peach et al. |
| 6,310,755 B1 | 10/2001 | Kholodenko et al. |
| 6,313,649 B2 | 11/2001 | Harwood et al. |
| 6,320,372 B1 | 11/2001 | Keller |
| 6,320,396 B1 | 11/2001 | Nikawa |
| 6,335,628 B2 | 1/2002 | Schwindt et al. |
| 6,362,636 B1 | 3/2002 | Peters et al. |
| 6,380,751 B2 | 4/2002 | Harwood et al. |
| 6,396,296 B1 | 5/2002 | Tarter et al. |
| 6,407,560 B1 | 6/2002 | Walraven et al. |
| 6,424,141 B1 | 7/2002 | Hollman et al. |
| 6,445,202 B1 | 9/2002 | Cowan et al. |
| 6,480,013 B1 | 11/2002 | Nayler et al. |
| 6,483,327 B1 | 11/2002 | Bruce et al. |
| 6,483,336 B1 | 11/2002 | Harris et al. |
| 6,486,687 B2 | 11/2002 | Harwood et al. |
| 6,488,405 B1 | 12/2002 | Eppes et al. |
| 6,489,789 B2 | 12/2002 | Peters et al. |
| 6,492,822 B2 | 12/2002 | Schwindt et al. |
| 6,501,289 B1 | 12/2002 | Takekoshi |
| 6,549,022 B1 | 4/2003 | Cole, Jr. et al. |
| 6,549,026 B1 | 4/2003 | Dibattista et al. |
| 6,549,106 B2 | 4/2003 | Martin |
| 6,573,702 B2 | 6/2003 | Marcuse et al. |
| 6,605,951 B1 | 8/2003 | Cowan |
| 6,605,955 B1 | 8/2003 | Costello et al. |
| 6,608,494 B1 | 8/2003 | Bruce et al. |
| 6,608,496 B1 | 8/2003 | Strid et al. |
| 6,617,862 B1 | 9/2003 | Bruce |
| 6,621,082 B2 | 9/2003 | Morita et al. |
| 6,624,891 B2 | 9/2003 | Marcus et al. |
| 6,633,174 B1 | 10/2003 | Satya et al. |
| 6,636,059 B2 | 10/2003 | Harwood et al. |
| 6,639,415 B2 | 10/2003 | Peters et al. |
| 6,642,732 B2 | 11/2003 | Cowan et al. |
| 6,643,597 B1 | 11/2003 | Dunsmore |
| 6,686,753 B1 | 2/2004 | Kitahata |
| 6,701,265 B2 | 3/2004 | Hill et al. |
| 6,710,798 B1 | 3/2004 | Hershel et al. |
| 6,720,782 B2 | 4/2004 | Schwindt et al. |
| 6,724,205 B1 | 4/2004 | Hayden et al. |
| 6,724,928 B1 | 4/2004 | Davis |
| 6,734,687 B1 | 5/2004 | Ishitani et al. |
| 6,744,268 B2 | 6/2004 | Hollman |
| 6,771,090 B2 | 8/2004 | Harris et al. |
| 6,771,806 B1 | 8/2004 | Satya et al. |
| 6,774,651 B1 | 8/2004 | Hembree |
| 6,777,964 B2 | 8/2004 | Navratil et al. |
| 6,788,093 B2 | 9/2004 | Aitren et al. |
| 6,791,344 B2 * | 9/2004 | Cook et al. ................. 324/754 |
| 6,801,047 B2 | 10/2004 | Harwood et al. |
| 6,806,724 B2 | 10/2004 | Hayden et al. |
| 6,836,135 B2 * | 12/2004 | Harris et al. ................. 324/765 |
| 6,838,885 B2 | 1/2005 | Kamitani |
| 6,842,024 B2 * | 1/2005 | Peters et al. ................. 324/754 |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,873,167 B2 * | 3/2005 | Goto et al. .................. 324/754 |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,927,079 B1 | 8/2005 | Fyfield |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |

| | | | | | | |
|---|---|---|---|---|---|---|
| 7,005,879 | B1 | 2/2006 | Robertazzi | EP | 0 087 497 | 9/1983 |
| 7,006,046 | B2 | 2/2006 | Aisenbrey | EP | 0 201 205 | 12/1986 |
| 7,007,380 | B2 | 3/2006 | Das et al. | EP | 0 314 481 | 5/1989 |
| 7,009,188 | B2 | 3/2006 | Wang | EP | 0 333 521 | 9/1989 |
| 7,009,383 | B2 | 3/2006 | Harwood et al. | EP | 0 460 911 | 12/1991 |
| 7,009,415 | B2 | 3/2006 | Kobayashi et al. | EP | 0 574 149 | 12/1993 |
| 7,011,531 | B2 | 3/2006 | Egitto et al. | EP | 0 706 210 | 4/1996 |
| 7,012,425 | B2 | 3/2006 | Shoji | EP | 0 573 183 | 1/1999 |
| 7,012,441 | B2 | 3/2006 | Chou et al. | GB | 2 197 081 | 5/1988 |
| 7,013,221 | B1 | 3/2006 | Friend et al. | JP | 53-052354 | 5/1978 |
| 7,014,499 | B2 | 3/2006 | Yoon | JP | 56-007439 | 1/1981 |
| 7,015,455 | B2 | 3/2006 | Mitsuoka et al. | JP | 62-011243 | 1/1987 |
| 7,015,689 | B2 | 3/2006 | Kasajima et al. | JP | 63-143814 | 6/1988 |
| 7,015,690 | B2 | 3/2006 | Wang et al. | JP | 1-165968 | 6/1989 |
| 7,015,703 | B2 | 3/2006 | Hopkins et al. | JP | 1-178872 | 7/1989 |
| 7,015,707 | B2 | 3/2006 | Cherian | JP | 1-209380 | 8/1989 |
| 7,015,708 | B2 | 3/2006 | Beckous et al. | JP | 1-214038 | 8/1989 |
| 7,015,709 | B2 | 3/2006 | Capps et al. | JP | 1-219575 | 9/1989 |
| 7,015,710 | B2 | 3/2006 | Yoshida et al. | JP | 1-296167 | 11/1989 |
| 7,015,711 | B2 | 3/2006 | Rothaug et al. | JP | 2-22837 | 1/1990 |
| 7,019,541 | B2 | 3/2006 | Kittrell | JP | 2-22873 | 1/1990 |
| 7,019,544 | B1 | 3/2006 | Jacobs et al. | JP | 3-67187 | 3/1991 |
| 7,020,360 | B2 | 3/2006 | Satomura et al. | JP | 3-175367 | 7/1991 |
| 7,020,363 | B2 | 3/2006 | Johannessen | JP | 5-157790 | 6/1993 |
| 7,022,976 | B1 | 4/2006 | Santana, Jr. et al. | JP | 5-166893 | 7/1993 |
| 7,022,985 | B2 | 4/2006 | Knebel et al. | JP | 60-71425 | 3/1994 |
| 7,023,225 | B2 | 4/2006 | Blackwood | JP | 7005078 | 1/1995 |
| 7,023,226 | B2 | 4/2006 | Okumura et al. | JP | 10-116866 | 5/1998 |
| 7,023,229 | B2 | 4/2006 | Maesaki et al. | JP | 10-339743 | 12/1998 |
| 7,023,231 | B2 | 4/2006 | Howland, Jr. et al. | JP | 11-031724 | 2/1999 |
| 7,025,628 | B2 | 4/2006 | LaMeres et al. | JP | 2001-189285 | 7/2001 |
| 7,026,832 | B2 | 4/2006 | Chaya et al. | JP | 2001-189378 | 7/2001 |
| 7,026,833 | B2 | 4/2006 | Rincon et al. | JP | 2002033374 | 1/2002 |
| 7,026,834 | B2 | 4/2006 | Hwang | JP | 2002-164396 | 6/2002 |
| 7,026,835 | B2 | 4/2006 | Farnworth et al. | WO | WO 80/00101 | 1/1980 |
| 7,030,599 | B2 | 4/2006 | Douglas | WO | WO 86/07493 | 12/1986 |
| 7,032,307 | B2 | 4/2006 | Matsunaga et al. | WO | WO 89/04001 | 5/1989 |
| 7,034,553 | B2 | 4/2006 | Gilboe | WO | WO 01/69656 | 9/2001 |
| 7,035,738 | B2 | 4/2006 | Matsumoto et al. | WO | WO 2004/049395 | 6/2004 |
| 7,101,797 | B2 | 9/2006 | Yuasa | | | |
| 2001/0009377 | A1 | 7/2001 | Schwindt et al. | | | |
| 2001/0010468 | A1 | 8/2001 | Gleaseon et al. | | | |
| 2001/0020283 | A1 | 9/2001 | Sakaguchi | | | |
| 2001/0030549 | A1 | 10/2001 | Gleason et al. | | | |
| 2002/0075027 | A1* | 6/2002 | Hollman et al. ............ 324/765 | | | |
| 2002/0118009 | A1 | 8/2002 | Hollman et al. | | | |
| 2003/0062915 | A1 | 4/2003 | Arnold et al. | | | |
| 2003/0071631 | A1 | 4/2003 | Alexander | | | |
| 2003/0141861 | A1 | 7/2003 | Navratil et al. | | | |
| 2004/0061514 | A1 | 4/2004 | Schwindt et al. | | | |
| 2004/0095145 | A1 | 5/2004 | Boudiaf et al. | | | |
| 2004/0100276 | A1 | 5/2004 | Fanton | | | |
| 2004/0113639 | A1 | 6/2004 | Dunklee et al. | | | |
| 2004/0162689 | A1 | 8/2004 | Jamneala et al. | | | |
| 2004/0193382 | A1 | 9/2004 | Adamian et al. | | | |
| 2004/0199350 | A1 | 10/2004 | Blackham et al. | | | |
| 2004/0207424 | A1 | 10/2004 | Hollman | | | |
| 2004/0251922 | A1 | 12/2004 | Martens et al. | | | |
| 2005/0024069 | A1 | 2/2005 | Hayden et al. | | | |
| 2005/0099192 | A1* | 5/2005 | Dunklee et al. ............ 324/754 | | | |
| 2005/0227503 | A1 | 10/2005 | Reitinger | | | |
| 2006/0114012 | A1 | 6/2006 | Reitinger | | | |
| 2006/0158207 | A1 | 7/2006 | Reitinger | | | |

FOREIGN PATENT DOCUMENTS

| | | |
|---|---|---|
| DE | 31 14 466 | 3/1982 |
| DE | 31 25 552 | 11/1982 |
| DE | 41 09 908 | 10/1992 |
| DE | 43 16 111 | 11/1994 |
| DE | 195 41 334 | 9/1996 |
| DE | 196 16 212 | 10/1996 |
| DE | 196 18 717 | 1/1998 |

OTHER PUBLICATIONS

John a. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Signatone S-1240 Thermal Controller, 2 page description, no date.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

The Micromanipulator Company, "Semi-Automatic Probing Stations and Accessories," pp. 1-12, no date.

Integrated Technology Corporation, "Probitt PB500A Probe Card Repair and Analysis Station," 4 pages, no date.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

J. Martens, Anritsu Company, 490 Jarvis Drive, Morgan Hill, CA 95037, "Multiport SOLR Calibrations: Performance and an Analysis of some Standards Dependencies," pp. 205-213, no date.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures," pp. 2-5, no date.

Cascade Microtech, "Model 42/42D Microwave Probe Station Instruction Manual, Electrical Operation," pp. 4-1-4-42, no date.

Inter-Continental Microwave, "Microwave Semiconductor Chip Measurements using the HP 8510B TRL-Calibration Technique," Application Note: 101, no date.

Design Technique, "Microstrip Microwave Test Fixture," May 1986, 2 pages.

PHOTO: Micromanipulator Probe Station 1994.

Micromanipulator Sales and Services Inc., "Test Station Accessories," Copyright 1983, 1984, 1 page.

Ruedi Aebersold & Matthias Mann, "Insight Review Articles, Mass spectrometry-based proteomics," Nature, vol. 422, Mar. 13, 2003, pp. 198-207.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog,", no date.

Hewlett Packard, "HP 4284A Precision LCR Meter Operation Manual (Including Option 001, 002, 006, 201, 202, 301)," Third Edition, Dec. 1991, pp. 2-1, 6-9, 6-16, no date.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

TEMPTRONIC, "Guarded" Chuck Sketch, Nov. 15, 1989.

Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8, no date.

Andrej Sali, Robert Glaeser, Thomas Earnest & Wolfgang Baumeister, "From words to literature in structural proteomics," Insight: Review Article, Nature 422, pp. 216-225, Mar. 13, 2003.

Mike Tyers & Matthias Mann, "From genomics to proteomics," Insight overview, Nature vol. 422 Mar. 2003, pp. 193-197.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Sam Hanash, "Disease proteomics," Insight Review Articles, Nature, vol. 422, Mar. 13, 2003, pp. 226-232.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between −196 and 350° C.,"
U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE 68th Street, Mercer Island, Washington 98040, no date.

L. L. Shon, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Daniel Van Der Weide, "THz Frequency Science & Technology Biomolecular Interaction Sensing with Sub-Terahertz Fields," University of Wisconsin-Madison, 2 pages, no date.

Mark S. Boguski & Martin W. McIntosh, "Biomedical Informatics for proteomics," Insight: review article, Nature 422, Mar. 13, 2003, pp. 233-237.

Saswata Basu & Reed Gleason, "A Membrane Quadrant Probe for R&D Applications," Cascade Microtech, Inc. 14255 SW Brigadoon Ct., Beaverton, OR 97005, 3 pages, no date.

The Micromanipulator Company, Inc., "Model 8000 Test Station," 1986, 1 page.

The Micromanipulator Company, Inc. "Model 8000 Test Station," 1988, 1 page.

"Vacuum," Mechanical Operation, pp. 3-8-3-9, no date.

The Micromanipulator Company, Inc., "Accessories: Hot and Hot/Cold Chucks, Integrated Dry environments, Triaxial chucks, Integrated Shielded and Dark environments, Probe Card Holders," p. 8, no date.

Microwave Products, Microwave Journal, Sep. 1988, 1 page.

Cascade Microtech, "Advanced On-Wafer Device Characterization Using the Summit 10500," pp. 2-20, no date.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications—High Speed DC Characterization of Semiconductor Devices from Sub pA to 1A," Nov. 1987, pp. 1-4.

Doug Rytting, "Appendix to an Analysis of Vector Measurement Accuracy Enhancement Techniques," pp. 1-42, Hewlett Packard, no date.

Temptronic Corporation, "Application Note 1 Controlled Environment Enclosure For low temperature wafer probing in a moisture-free environment," 2 pages, no date.

*Cascade Microtech, Inc.* vs. *Micromanipulator Company, Inc.*, "Deposition of Harry F. Applebay," United States District Court for the District of Oregon, Lead Case No. 97-479-Al, no date.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

* cited by examiner

SWITCHED SUSPENDED CONDUCTOR AND CONNECTION

CROSS REFERENCE TO RELATED DOCUMENTS

This application claims the benefit of U.S. Provisional Application No. 60/468,851, filed May 6, 2003.

BACKGROUND OF THE INVENTION

The present invention relates to a wafer assembly having a switch mechanism that, in one embodiment, selectively and alternately electrically connects a suspended element or connection with the probe assembly.

Testing of electrical devices is accomplished by routing a test signal through a probe assembly to selected contact points on a device under test (DUT). Measurement devices are then used to determine the voltages and/or currents generated in the DUT in response to that test signal.

When probing a DUT, it is highly desirable to protect the probe assembly from electrical interference that can result, for example, from dynamic electromagnetic fields present in the immediate vicinity of the probe assembly. To reduce this type of interference, probe assemblies commonly provide the test signal through a coaxial or triaxial cable so that the test signal may be guarded and/or shielded. In this arrangement, the center conductor of the coaxial or triaxial cable carries the test signal. A guard signal, preferably substantially identical to the test signal, or otherwise "follows" the test signal, is routed through either the outer conductor of a coaxial cable, or the middle conductor of a triaxial cable. If a triaxial cable is employed, a shield signal, which is typically instrumental "ground" or another relatively constant potential, may be provided through the outer conductor.

The DUT typically rests upon the top layer of a multilayer electrically conductive chuck where each layer is insulated from the others. The guard may be connected to the second layer of the chuck and, if desired, a conductive plate may laterally surround the chuck. The shield may be connected to the third layer of the chuck.

It is desirable to closely match the signals between the test signal and the guard. Because the shield is exposed to external interference along its outer periphery it will not ordinarily match precisely the guard signal it encloses. The resulting discrepancy between the shield and guard signals permits some interference to affect the guard signal. The modified guard signal in turn affects the test signal. Usually, the resulting interference is insignificant. However, when the test signal to the DUT is very small, even this amount of interference can be significant.

When small amounts of interference are significant, further reduction in the interference can be obtained by locating a suspended conductive plate over the DUT and connecting it to the guard signal. The suspended conductive plate defines a central opening so that the probe assembly may make electrical contact with the DUT. In this fashion, the DUT may be guarded from all sides by signals closely approximating that delivered to the DUT.

Another problem that occurs when testing a DUT with a probing assembly is that chuck and/or cable impedances can often inhibit accurate measurement of the voltages and/or currents present in response to the applied test signal. This problem is particularly prevalent with high-current test signals where the voltage drop along the cable and/or through the chuck can be significant.

The typical adaptation to this problem is to connect a second coaxial or triaxial cable to the probe assembly in the same manner as the first. In this two-cable configuration, commonly referred to as a Kelvin connection, one cable provides the "force" (e.g. a low impedance connection that primarily supplies a current) while the other cable provides a "sense" (e.g. a high impedance connection that primarily senses a voltage) used to measure the resulting voltages and/or currents present within the DUT. In a "true" Kelvin connection, both the force and the sense comprise independent paths from the test equipment to the DUT. Alternatively, both the force and the sense lines may be connected at a common interconnection point, that is as close to the DUT as possible, frequently referred to as a quasi-Kelvin connection.

Designing a probe assembly that provides both a suspended guard and a Kelvin connection has recently become problematical because of the total capacitance seen by the measurement equipment. Measurement equipment that is used in conjunction with the probe assembly only provides valid measurements so long as total circuit capacitance remains within specified parameters. In addition, testing equipment imposes capacitance restrictions between the force and guard, and the guard and shield, respectively.

Historically, probe assemblies containing both a suspended guard and a Kelvin connection could be designed within the capacitance limitations set by the testing equipment. In recent years, the industry has moved towards manufacturing individual electrical devices, such as silicon semiconductor components, on a larger-sized 12" wafer. Any probe assembly that tests a DUT on such a wafer must therefore have a larger chuck, which adds capacitance to the probe assembly. The available capacitance permitted to be connected to the instrumentation that is not used by the chuck now must be rationed carefully. Both a suspended guard and a Kelvin connection add capacitance to the test circuit loop, and it has proven difficult to design a probe assembly that contains both elements, yet remains within the capacitance restrictions set by the measurement equipment.

What is desired, therefore, is a probe assembly that may accurately test electrical components and that includes a suspended guard and another connection.

DETAILED DESCRIPTION OF THE PREFERRED EMBODIMENT

Figure 1:
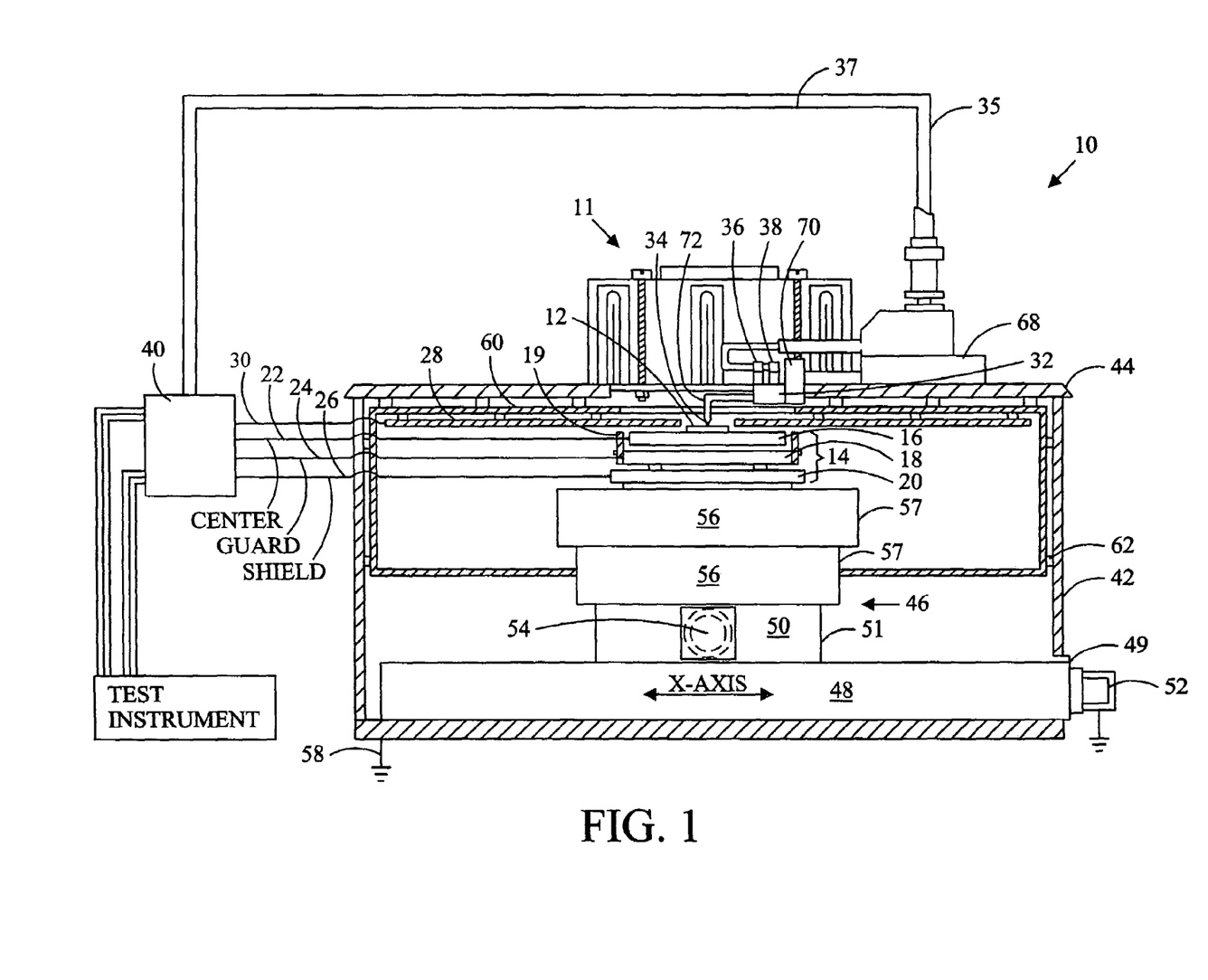
FIG. 1 shows a cross-sectional view of a probe assembly that includes a Kelvin connection, a suspended guard element and a switching mechanism between the connection and suspended guard.

FIG. 1 shows a probe station 10 having a probe assembly 11 and a multilayered chuck assembly 14 that may be used to probe an electrical device 12. The chuck assembly 14 includes a top stage 16 that is electrically connected to a center signal 22. The center signal 22 may be the test signal return path to the signal delivered to the electrical device 12 when probed by probe assembly 11. To reduce electrical noise when the electrical device 12 is probed by the probe assembly 11, the chuck assembly 14 also includes a center layer 18 that is electrically connected to a guard signal 24, and a bottom layer 20 that is electrically connected to a shield signal 26. The guard signal 24 may approximate the signal delivered to the electrical device 12 when probed. Some probe assemblies, like that disclosed in Peters et al., U.S. Pat. No. 6,002,263, utilize a variable shield signal which may be switched to other electric potentials. The manner in which center, guard, and shield signals are connected to their respective chuck stages is well known in industry, as disclosed for example, by Schwindt et al., U.S. Pat. No. 5,434,512.

The guard signal 24 may also be connected to a ring-shaped enclosure 19 that surrounds the top layer 16 and the middle layer 18 of the chuck assembly 14 along with the electrical device 12 being probed. In instances where further reduction in noise is desired, the probe assembly 10 includes a conductive guard element 28 positioned over the electrical device 12 being probed. The guard element 28, along with the center signal 22, the guard signal 24, and the shield signal 26 are electrically connected to a switching mechanism 40. It is to be understood that the suspended guard 28 may be merely vertically spaced apart from the DUT, whether above or below the chuck. Preferably, the suspended guard 28 is at least partially horizontally overlapping with the chuck and/or DUT supported by the chuck (but need not be). More preferably, the suspended guard is horizontally overlapping with the chuck and/or DUT supported by the chuck over a major portion of the chuck and/or DUT, respectively.

The probe assembly 11 includes a probe 32 having a probe end 34 that contacts the electrical device 12 when probed. The probe 32 separately routes a force signal provided along a first electrical path 35 to a force connection 36 and a sense signal provided along a second electrical path 37 from a sense connection 38 to the probe end 34. As seen in FIG. 1, both the force signal provided along the electrical path 35 and the sense signal provided along the electrical path 37 are electrically connected to the switching mechanism 40.

Figure 2:
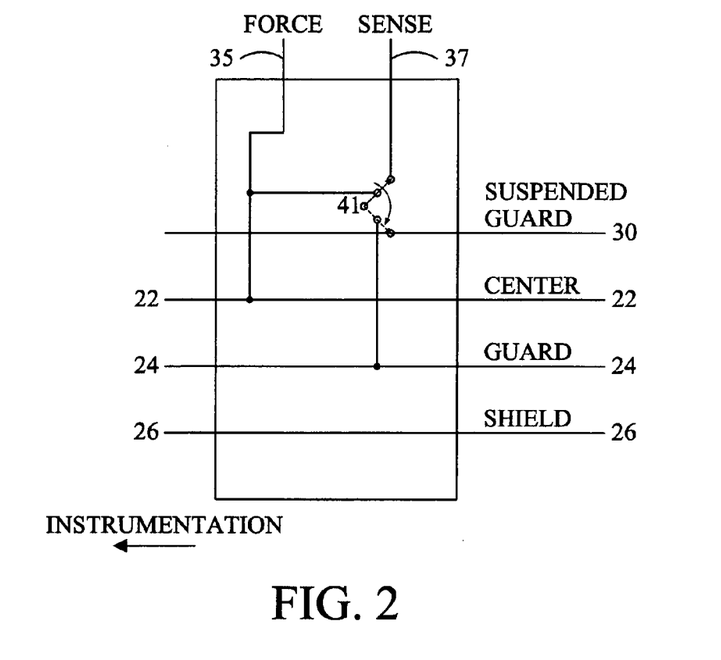
FIG. 2 shows a schematic for the switching mechanism shown in FIG. 1.

Referring to FIG. 2, the switching mechanism 40 receives the center signal 22, the guard signal 24, and the shield signal 26 from test instrumentation (not shown). The switching mechanism 40 routes signals to appropriate portions of the probe assembly 10. Referring also to FIG. 1, the center signal 22 is routed to the top layer 16 of the chuck assembly 14, and the force connection 36 of the probe 32 is routed through the force connection 35. The guard signal 24 is routed to the center layer 18 of the chuck assembly 14 and the ring-shaped enclosure 19. The shield signal 26 is routed to the bottom layer 20 of the chuck assembly 14 and an inner shield enclosure 60 surrounding the chuck assembly 14.

Because of capacitance constraints imposed by test instrumentation, difficulties have been encountered when attempting to probe a device using a probe assembly containing both a Kelvin connection and a suspended guard element. A suspended guard element is normally required when a low-current test signal is employed along a single cable to make measurements, such as the sense connection of a Kelvin connection. The present inventors realized that the suspended guard element may not be necessary when the system is making Kelvin measurements because in contrast, a force connection typically uses a high-current test signal. Based upon this realization, the present inventors recognized the potential advantage of a probe station that includes a switch that selectively connects the force connection while disconnecting the suspended guard element when taking Kelvin (or quasi-Kelvin) measurements, and disconnects the sense connection while connecting the suspended guard element for non-Kelvin measurements. In other words, the switch selectively connects one of the cables (force or sense) for testing while disconnecting the suspended guard, and vice versa. In this manner, the additional capacitance of the suspended guard may be selectively removed from the signal path when its benefits are minimal. It is likewise to be understood that the switch mechanism may take the form of one or more switches that alone or in combination result in selectively adding or removing a signal path during testing while also correspondingly removing and adding, respectively, the suspended guard to the signal path. While the switching may be performed by activating a single switch(s) which performs the changes simultaneously (or substantially simultaneously) the changes may be manual, mechanical, and/or electrical. Further, the suspended plate need not necessarily be connected to guard, and as such may be connected to the signal, the shield, permitted to float, grounded, or otherwise. Moreover, the switching mechanism may likewise be useful for non-Kelvin testing. Further, the force, sense, or otherwise may be connected to the DUT, chuck, or otherwise, as desired.

As shown in FIG. 2, a switch 41 permits the probe station to be operated in two modes. In the first mode, the switch 41 electrically connects the center signal 22 to the sense connection 38 through the sense path 37. In this first mode, the electrical path 30 to the suspended guard 28 is electrically disconnected from the test instrumentation. In the second mode, the switch 41 electrically connects the guard signal 24 to the suspended guard 28 through the electrical path 30. In the second mode, the sense connection 38 is electrically disconnected from the test instrumentation. Accordingly, the center signal 22 may be used for testing purposes, if desired.

It is to be understood that more than one guard path or potential may be provided to the probe station, such as for example, a separate guard for the force and sense. Also, one or more test instruments may be used, collectively referred to as the test instrument. In addition, it may be advantageous under different circumstances to merely include a switch mechanism for the suspended guard to permit selectively including its respective capacitance in the signal path of the test instrument for any one or more channels.

Chuck Enclosure

A chuck assembly 14 for supporting a test device is laterally positionable by a chuck positioner assembly 46 having an orthoganally arranged lateral X-axis positioner 48 and Y-axis positioner 50. The lateral X-axis positioner 48 has a laterally extending positioning screw (not shown) driven by an electric motor 52. The X-axis positioner is partially enclosed by a conductive housing 49 and optionally also by flexible pleated rubber boots (not shown) for accommodating positioning movements while preventing the entry of dirt particles. The X-axis positioner 48 selectively moves a Y-axis positioner 50, oriented perpendicularly to the X-axis positioner 48.

The lateral Y-axis positioner 50 is constructed similarly to the X-axis positioner 48, and includes an outer conductive housing 51 with optional flexible pleated rubber boots (not shown). The conductive housing 51 is electrically connected to the conductive housing 49 of the X-axis positioner. A motor 54 provides for adjustable movement of the Y-axis positioner.

A conventional Z-axis positioner 56, having a conductive outer housing 57 electrically connected to the conductive housing 51 of the Y-axis positioner 50 is moveable along the Y-axis by the Y-axis positioner 50. The Z-axis positioner includes respective internal electric motors and plunger assemblies (not shown) to effect vertical movement with respect to the X-axis positioner 48 and the Y-axis positioner 50. Such mechanisms are well known and used in existing probe assemblies, as shown for example, by Peters et al., U.S. Pat. No. 6,002,263.

The outer conductive enclosure 42 is connected by a low impedance path 58 directly to AC ground. Collectively, the outer enclosure 42, a platen 44, and the conductive housings 49, 51, and 57 cooperate to provide an electrically conductive outer shield enclosure which helps to insulate the chuck assembly from environmental noise sources located externally of the enclosure 42 or internally within the positioner housings from motors, etc.

An electrically conductive inner shield enclosure 60, which also preferably acts as the probe station's environmental control enclosure not only for purposes of EMI shielding but also for purposes of maintaining a dry and/or dark environment, is mounted by dielectric spacers 62 to the interior of the outer enclosure 42 so as to be interposed between and insulated from the outer enclosure 42 and the top layer 16 and center layer 18 of the chuck assembly 14. In this fashion, the outer shield components 42, 44, 49, 51, and 57 protect the inner shield 60 from external noise sources so that the inner shield 60, in turn, can minimize noise-induced spurious currents affecting the top layer 16 and center layer 18 of the chuck assembly 14, and thereby maximize the accuracy of the test measurements.

Probe Assembly

Figure 3:
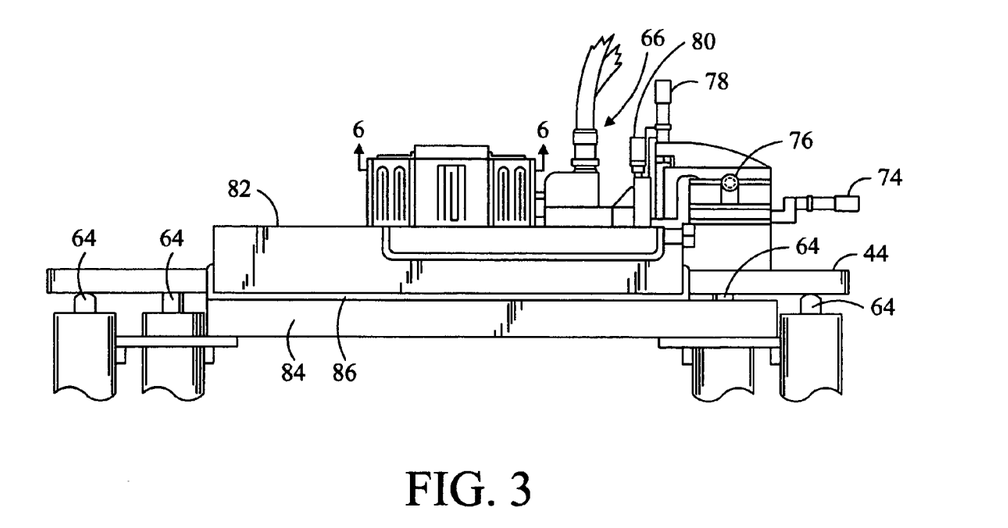
FIG. 3 shows a front view of an alternate embodiment of the top portion of the probe assembly shown in FIG. 1.
Figure 4:
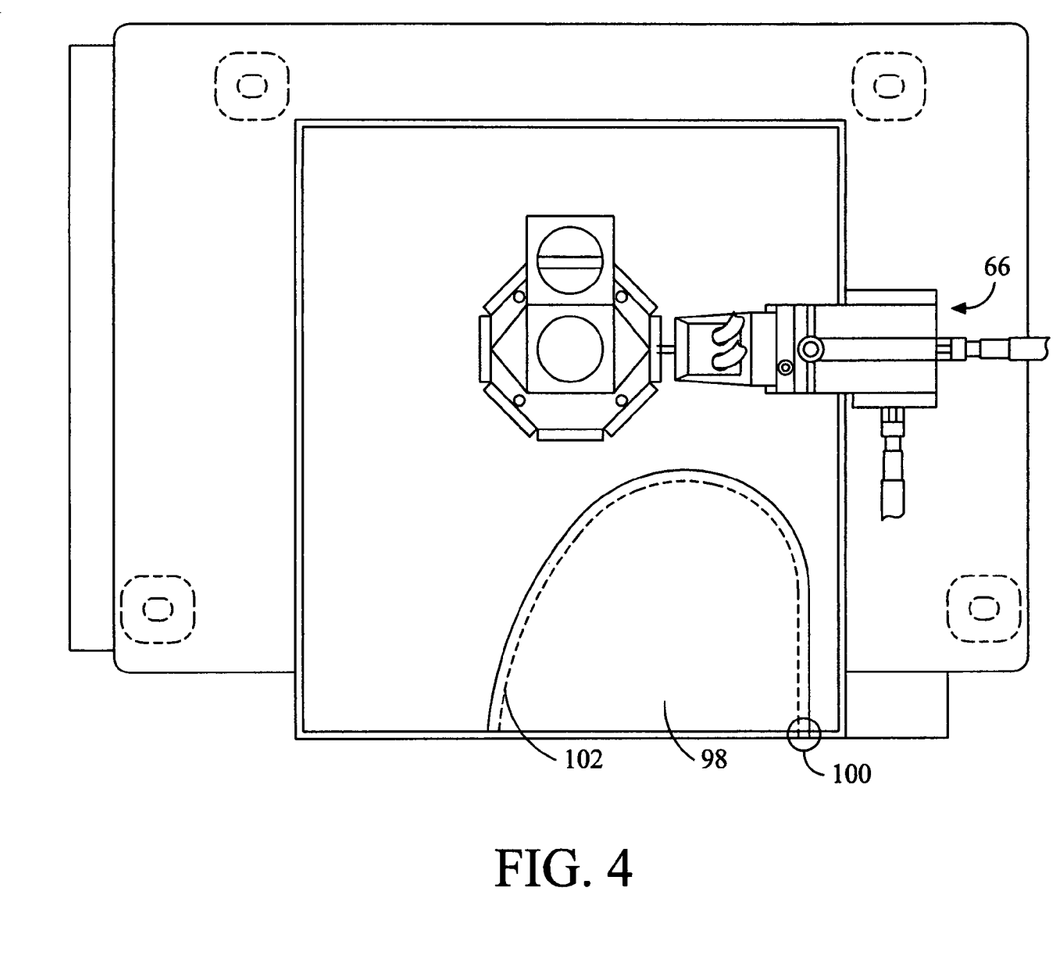
FIG. 4 shows a top view of the probe assembly shown in FIG. 1.

Referring to FIGS. 1, 3, and 4, the probe station 10 includes the electrically conductive outer enclosure 42 including the conductive platen 44 electrically connected thereto. The platen 44 may be supported by a series of jacks 64 that selectively raise and lower the platen vertically by a small increment (approximately one-tenth of an inch). The platen 44, when moved vertically by the jacks 64, move independently of the chuck assembly 14 and the chuck assembly positioner 46.

Mounted atop the platen 44 are multiple individual probe positioners such as 66 (only one of which is shown), each having an extending member 68 to which is mounted a probe holder 70 which in turn supports a respective probe 72 for contacting wafers and other test devices mounted atop the chuck assembly 14. The probe positioner 66 has micrometer adjustments 74, 76 and 78 for adjusting the position of the probe holder 70, and thus the probe 72 along the X, Y and Z axes, respectively, relative to the chuck assembly 14. The Z axis is exemplary of what is referred to herein loosely as the "axis of approach" between the probe holder 70 and the chuck assembly 14, although directions of approach which are neither vertical not linear, along which the probe tip and wafer or other test device are brought into contact with each other, are also intended to be included within the meaning of the term "axis of approach." A further micrometer adjustment 80 adjustably tilts the probe holder 70 to adjust planarity of the probe with respect to the wafer or other test device supported by the chuck assembly 14. As many as twelve (or more) individual probe positioners 66, each supporting a respective probe, may be arranged on the platen 44 around the chuck assembly 14 so as to converge radially toward the chuck assembly 14 similarly to the spokes of a wheel. With such an arrangement, each individual positioner 66 can independently adjust its respective probe in the X, Y and Z directions, while the jacks 64 can be actuated to raise or lower the platen 44 and thus all of the positioners and their respective probes in unison.

The environment control enclosure is composed of an upper box portion 82 rigidly attached to the platen 44 and a lower box portion 84 rigidly attached to the conductive outer enclosure 42 of the chuck assembly 14. Both the upper box portion 92 and the lower box portion 84 are made of steel or other suitable electrically conductive material to provide EMI shielding. To accommodate the small vertical movement between the two box portions 82 and 84 when the jacks 64 are actuated to raise or lower the platen 44, an electrically conductive resilient foam gasket 86, preferably composed of silver or carbon-impregnated silicone, is interposed peripherally at their mating juncture at the front of the enclosure and between the lower box portion 84 and the platen 44 so that an EMI, substantially hermetic, and light seal are all maintained despite relative vertical movement between the two box portions 82 and 84. Even though the upper box portion 82 is rigidly attached to the platen 44, a similar gasket (not shown) is preferably interposed between the portion 82 and the top of the platen to maximize sealing.

Figure 6:
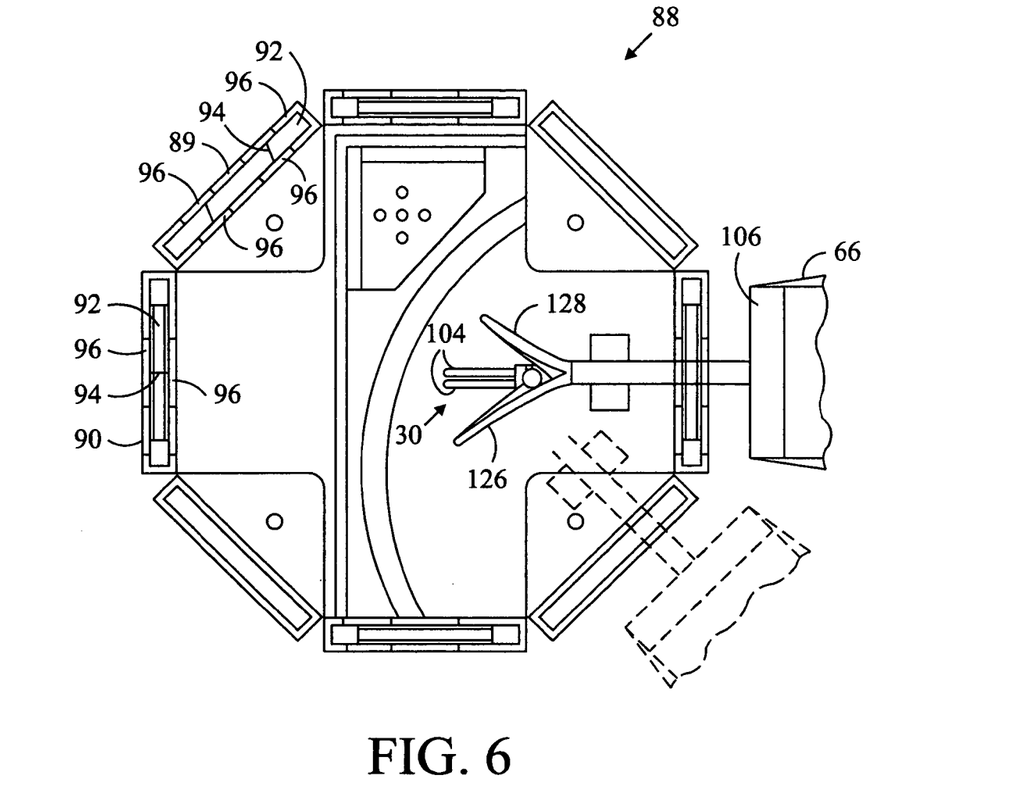
FIG. 6 shows a top sectional view taken along line 6—6 in FIG. 3.

With reference to FIG. 6, the top of the upper box portion 82 comprises an octagonal steel box 88 having eight side panels such as 89 and 90 through which the respective probe positioners 66 can penetrate movably. Atop the octagonal steel box 88 a circular viewing aperture (not shown) is provided having a recessed circular transparent sealing window therein. Each panel comprises a hollow housing in which a respective sheet 92 of resilient foam, which may be similar to the above-identified gasket material, is placed. Slits such as 94 are partially cut vertically in the foam in alignment with slots 96 formed in the inner and outer surfaces of each panel housing, through which a respective probe positioner 66 can pass movably. The slitted foam permits X, Y and Z movement of each probe positioner, while maintaining the EMI, substantially hermetic, and light seal provided by the enclosure.

Referring to FIG. 4, the upper box portion 82 of the environment control enclosure also includes a hinged steel door 98 that pivots outwardly about the pivot axis of a hinge 100. The hinge biases the door downwardly toward the top of the upper box portion 82 so that it forms a tight, overlapping sliding peripheral seal 102 with the top of the upper box portion. When the door is open, and the chuck assembly 14 is moved by the chuck positioner assembly 46 beneath the door opening, the chuck assembly 14 is accessible for loading and unloading.

Figure 5:
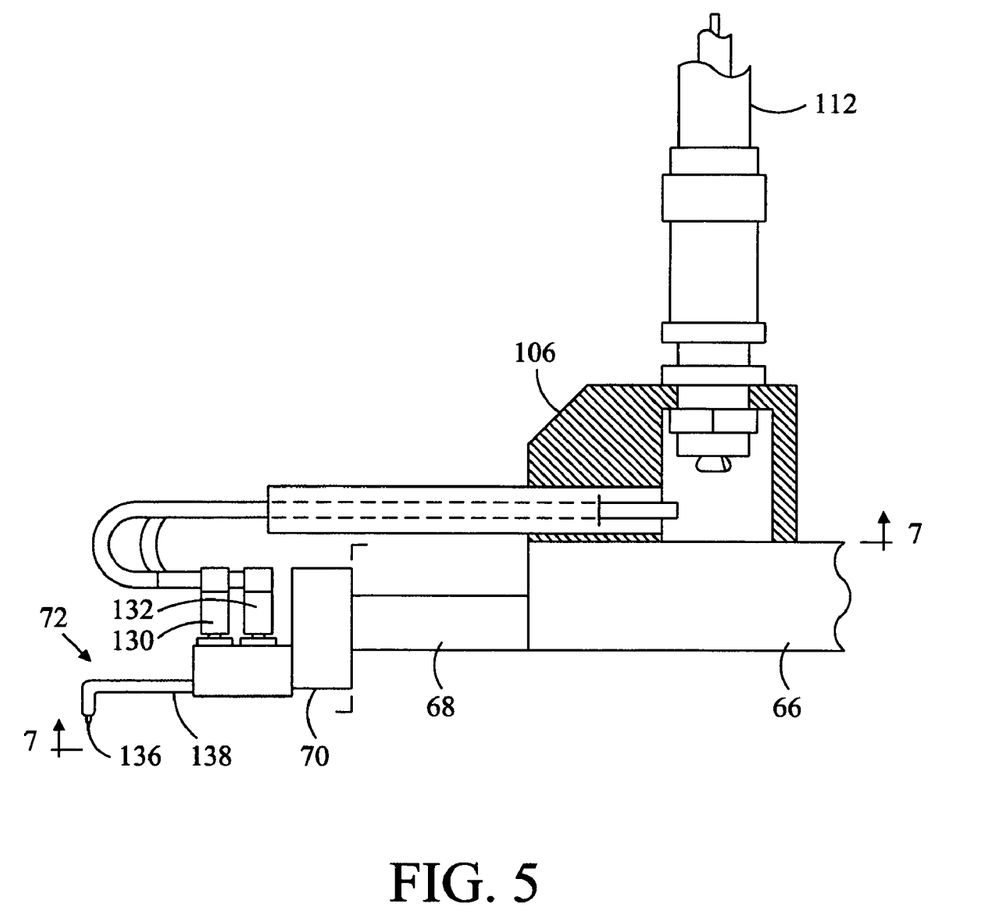
FIG. 5 shows a partially sectional side view of the probe and probe holder shown in the probe assembly in FIG. 1.
Figure 7:
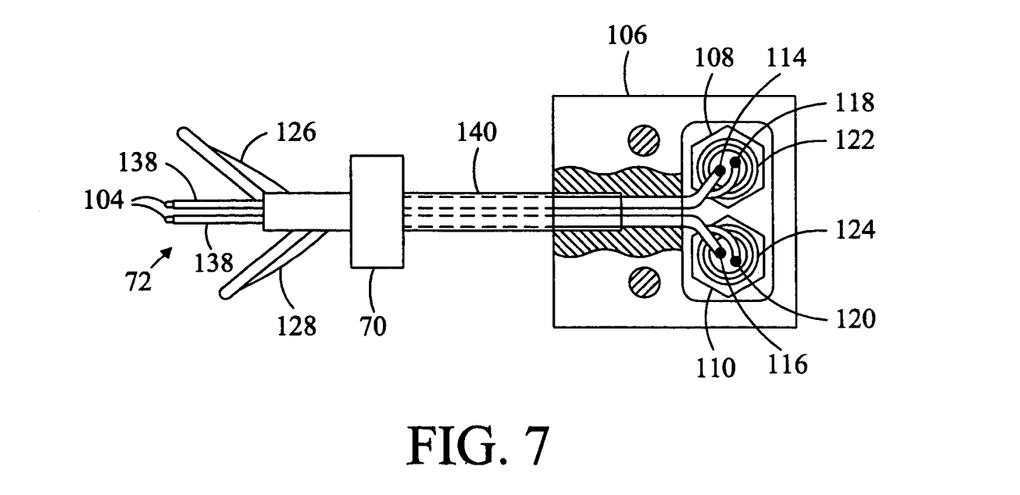
FIG. 7 shows a partially sectional bottom view of the probe assembly taken along line 7—7 in FIG. 5.

With reference to FIGS. 5, 6 and 7, respective individually movable probes 72 comprising pairs of probe elements 104 are supported by respective probe holders 70 which in turn are supported by respective extending members 68 of different probe positioners such as 66. Atop each probe positioner 66 is a shield box 106 having a pair of triaxial connectors 108, 110 mounted thereon with respective triaxial cables 112 entering each triaxial connector from a suitable test instrument as mentioned previously. Each triaxial connector includes a respective inner connector element 114, 116, an intermediate connector element 118, 120, and an outer connector element 122, 124 in concentric arrangement. Each outer connector element 122, 124 terminates by connection with the shield box 106. Conversely, the inner connector elements 114, 116, and the intermediate connector elements 118, 120, are connected, respectively, to the inner and outer conductors of a pair of coaxial cables 126, 128 which therefore are guarded cables. Each cable 126, 128 terminates through a respective coaxial connector 130, 132 with a respective probe element 104 having a center conductor 136 surrounded by a guard 138. In order to provide adequate shielding for the coaxial cables 126, 128, especially in the region outside of the octagonal box 88, an electrically-conductive shield tube 140 is provided around the cables 126, 128 and electrically connected through the shield box 106 with the outer connector element 122, 124 of the respective triaxial connectors 108, 110. The shield tube 140 passes through the same slit in the sheet of foam 92 as does the probe positioner 66. Thus, each individually movable probe has not only its own separate individually movable probe holder but also its own individually movable shield for its guarded coaxial cables, which shield is movable in unison with the probe holder independently of the movement of any other probe holder by any other positioning mechanism. This feature is particularly advantageous because such individually movable probes are normally not equipped for both shielded and guarded connections, which deficiency is solved by the described structure. Accordingly, the probes 72 are capable of being used with the same guarding and Kelvin connection techniques in a ready-to-use manner as is the chuck assembly 14, consistently with full shielding despite the individual positioning capability of each probe 72.

All references cited herein are incorporated by reference. The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. An assembly comprising:
    (a) a support suitable to support a device-under-test;
    (b) a first member defining a first electrical path to said device-under-test when supported by said support;
    (c) a second member defining a second electrical path to said device-under-test when supported by said support;
    (d) a conductive member vertically spaced apart from at least a portion of said support; and
    (e) a switch mechanism that alternately electrically connects said second member to a test instrument while electrically isolating said conductive member from said test instrument, and electrically isolates said second member from said test instrument while electrically connecting said conductive member to said test instrument.

2. The assembly of claim 1 wherein said conductive member is electrically connected to a guard potential.

3. The assembly of claim 1 wherein at least one of said first member and said second member is a cable.

4. The assembly of claim 1 wherein said first member and said second member form a Kelvin measurement.

5. The assembly of claim 1 wherein said first member and said second member form a quasi-Kelvin measurement.

6. The assembly of claim 4 wherein said second member is a sense connection.

7. The assembly of claim 5 wherein said second member is a sense connection.

8. The assembly of claim 1 wherein said isolating and said electrically connecting is substantially simultaneous.

9. The assembly of claim 1 wherein at least a portion of said conductive member at least partially overlaps said support.

10. An assembly comprising:
    (a) a support suitable to support a device-under-test;
    (b) a first member defining a first electrical path to said device-under-test when supported by said support;
    (c) a conductive member vertically spaced apart from at least a portion of said support; and
    (d) a switch mechanism that alternately electrically connects said first member to a test instrument while electrically isolating said conductive member from said test instrument, and electrically isolates said first member from said test instrument while electrically connecting said conductive member to said test instrument.

11. The assembly of claim 10 wherein said conductive member is electrically connected to a guard potential.

12. The assembly of claim 10 wherein said first member is a cable.

13. The assembly of claim 10 wherein said first member is part of a Kelvin measurement.

14. The assembly of claim 10 wherein said first member is a part of a quasi-Kelvin measurement.

15. The assembly of claim 13 wherein said first member is a sense connection.

16. The assembly of claim 14 wherein said first member is a sense connection.

17. The assembly of claim 10 wherein said isolating and said electrically connecting is substantially simultaneous.

18. The assembly of claim 10 wherein at least a portion of said conductive member at least partially overlaps said support.

* * * * *

UNITED STATES PATENT AND TRADEMARK OFFICE
CERTIFICATE OF CORRECTION

PATENT NO.         : 7,221,172 B2
APPLICATION NO. : 10/794511
DATED                  : May 22, 2007
INVENTOR(S)        : John Dunklee

Page 1 of 1

It is certified that error appears in the above-identified patent and that said Letters Patent is hereby corrected as shown below:

<u>Col. 5, line 60</u>
Change "vertical not linear" to --vertical nor linear--.

Signed and Sealed this

Eighth Day of July, 2008

JON W. DUDAS
*Director of the United States Patent and Trademark Office*